(12) United States Patent
Baars et al.

(10) Patent No.: US 8,697,557 B2
(45) Date of Patent: Apr. 15, 2014

(54) METHOD OF REMOVING GATE CAP MATERIALS WHILE PROTECTING ACTIVE AREA

(75) Inventors: Peter Baars, Dresden (DE); Till Schloesser, Dresden (DE); Frank Jakubowski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 181 days.

(21) Appl. No.: 13/154,521

(22) Filed: Jun. 7, 2011

(65) Prior Publication Data

US 2012/0313187 A1    Dec. 13, 2012

(51) Int. Cl.
*H01L 29/78* (2006.01)

(52) U.S. Cl.
USPC ........... 438/527; 438/595; 438/696; 257/393; 257/315; 257/E21.64; 257/E21.626

(58) Field of Classification Search
USPC ........... 438/527, 595, 696; 257/393, E21.626
See application file for complete search history.

(56) References Cited

U.S. PATENT DOCUMENTS

| | | | |
|---|---|---|---|
| 6,080,622 A | 6/2000 | Kang | |
| 6,737,716 B1 * | 5/2004 | Matsuo et al. | 257/406 |
| 7,040,967 B2 * | 5/2006 | Benner | 451/56 |
| 7,157,374 B1 | 1/2007 | Waite et al. | |
| 7,445,978 B2 | 11/2008 | Teh et al. | |
| 7,601,575 B2 * | 10/2009 | Bu et al. | 438/197 |
| 7,888,252 B2 | 2/2011 | Faltermeier et al. | |
| 7,928,000 B2 | 4/2011 | Kang et al. | |
| 8,039,381 B2 * | 10/2011 | Yeh et al. | 438/595 |
| 8,207,570 B2 * | 6/2012 | Alapati et al. | 257/315 |
| 2004/0157397 A1 * | 8/2004 | Quek | 438/305 |
| 2008/0061366 A1 * | 3/2008 | Liu et al. | 257/336 |
| 2008/0203474 A1 * | 8/2008 | Kang | 257/336 |
| 2010/0155852 A1 * | 6/2010 | Piazza et al. | 257/390 |
| 2011/0198675 A1 * | 8/2011 | Ng et al. | 257/288 |
| 2011/0230039 A1 * | 9/2011 | Mowry et al. | 438/527 |
| 2011/0266636 A1 * | 11/2011 | Rong | 257/408 |
| 2011/0278680 A1 * | 11/2011 | Tews et al. | 257/392 |
| 2012/0007051 A1 * | 1/2012 | Bangsaruntip et al. | 257/24 |

* cited by examiner

*Primary Examiner* — Stephen W Smoot
*Assistant Examiner* — Edward Chin
(74) *Attorney, Agent, or Firm* — Amerson Law Firm, PLLC (57) ABSTRACT

Disclosed herein is a method of forming a semiconductor device. In one example, the method includes forming a gate electrode structure above a semiconducting substrate, wherein the gate electrode structure includes a gate insulation layer, a gate electrode, a first sidewall spacer positioned proximate the gate electrode, and a gate cap layer, and forming an etch stop layer above the gate cap layer and above the substrate proximate the gate electrode structure. The method further includes forming a layer of spacer material above the etch stop layer, and performing at least one first planarization process to remove the portion of said layer of spacer material positioned above the gate electrode, the portion of the etch stop layer positioned above the gate electrode and the gate cap layer.

17 Claims, 4 Drawing Sheets

METHOD OF REMOVING GATE CAP MATERIALS WHILE PROTECTING ACTIVE AREA

BACKGROUND OF THE INVENTION

1. Field of the Invention

Generally, the present disclosure generally relates to the manufacturing of sophisticated semiconductor devices, and, more specifically, to methods of removing gate cap materials while protecting the active area from excessive attack during the cap removal process.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors (NMOS) and/or P-channel transistors (PMOS), are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends upon a variety of factors, such as the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on, among other things, the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

When advancing to sophisticated gate architecture based on high-k dielectrics, additionally, transistor performance may also be increased by providing an appropriate conductive material for the gate electrode to replace the typical polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed. For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. Given that the gate length on modern transistor devices may be approximately 30-50 nm, and that further scaling is anticipated in the future, device designers have employed a variety of techniques in an effort to improve device performance, e.g., the use of high-k dielectrics, the use metal gate electrode structures, the incorporation of work function metals in the gate electrode structure and the use of channel stress engineering techniques on transistors (create a tensile stress in the channel region for NMOS transistors and create a compressive stress in the channel region for PMOS transistors). Stress engineering techniques typically involve the formation of specifically made silicon nitride layers that are selectively formed above appropriate transistors, i.e., a layer of silicon nitride that is intended to impart a tensile stress in the channel region of a device would only be formed above the NMOS transistors. Such selective formation may be accomplished by masking the PMOS transistors and then blanket depositing the layer of silicon nitride, or by initially blanket depositing the layer of silicon nitride across the entire substrate and then performing an etching process to selectively remove the silicon nitride from the PMOS transistors. The techniques employed in forming such nitride layers for selective channel stress engineering purposes are well known to those skilled in the art.

Typically, one or more sidewall spacers are formed proximate the gate electrode structures of transistors for a variety of reasons, such as to protect the gate electrode materials, to insure that subsequent structures, such a metal silicide regions formed on the source and drain regions of a transistor, are formed a minimum distance away from the channel region of the device, etc. There is also, typically, a protective cap layer of silicon nitride formed on top of a polysilicon gate electrode (perhaps in combination with an underlying metal layer). This protective cap layer is needed to protect the gate electrode in some processing operations that are performed after the gate electrode is formed, like the formation of cavities in substrate of a PMOS transistor that will be filled with an epitaxial silicon-germanium material, or during processes used to form sidewall spacers. Ultimately, metal silicide regions are typically formed on the source/drain regions and the gate electrode of a transistor to reduce contact resistance. This requires that the protective cap layer be removed from the polysilicon gate structures so that a metal silicide region may be formed on the gate electrode. Typically, the protective cap layer on the gate electrode is removed by performing a reactive ion etching process. However, this etching process damages or recesses the substrate, particularly the epitaxial silicon-germanium regions of the PMOS transistors, and may reduce the thickness of the protective sidewall spacers which are also typically made of silicon nitride (the same material as the protective cap layer). Excessive erosion of the protective sidewall spacers can result in unacceptable shifts in the threshold voltage of the resulting transistors and/or increased yield loss to degradation of the gate electrode structure, e.g., a high-k/metal gate stack.

Some attempts have been made to address this issue. In one technique, a protective liner, e.g., silicon dioxide, may be formed on the gate electrode prior to the formation of the protective cap layer made of silicon nitride. The protective liner may be removed after the protective cap layer above the gate electrode is removed. However, during the etch process that is performed to remove the protective liner, there is a loss of material in the field oxide regions and the overall topology of the device may be adversely affected, which can adversely impact further processing operations, like the creation of more voids in various dielectric layers that will be formed above the device.

Another technique that has been tried involves the formation of a sacrificial fill material between adjacent gate electrode structures and perform a back etch on the fill material to expose the protective cap layer on the gate electrode. A reactive ion etching process is then performed to remove the protective cap layer while the fill material protects the substrate and the sidewall spacers during this etching process. This techniques suffers from poor consistency or homogeneity because the characteristics of the fill formation process and the etching of the protective cap layer on the gate electrode are dependent, to some degree, on the pattern density of the gate electrode structures, which can vary greatly across a typical integrated circuit device, even ignoring manufacturing errors in patterning the gate electrode structures.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to the manufacturing of sophisticated semiconductor devices, and, more specifically, to methods of removing gate cap materials while protecting the active area from excessive attack during the cap removal process, and to novel devices associated with this process. In one example, the method includes forming a gate electrode structure above a semiconducting substrate, wherein the gate electrode structure includes a gate insulation layer, a gate electrode, a first sidewall spacer positioned proximate the gate electrode, and a gate cap layer, and forming an etch stop layer above the gate cap layer and above the substrate proximate the gate electrode structure. The method further includes forming a layer of spacer material above the etch stop layer, and performing at least one first planarization process to remove the portion of said layer of spacer material positioned above the gate electrode, the portion of the etch stop layer positioned above the gate electrode and the gate cap layer.

In another illustrative example, the method includes forming a gate electrode structure that includes at least a gate insulation layer positioned on a surface of a semiconducting substrate, a gate electrode, a first sidewall spacer positioned proximate the gate electrode, and a gate cap layer positioned on the gate electrode, forming an etch stop layer on the gate cap layer and on a surface of the substrate proximate the gate electrode structure, and forming a layer of spacer material on the etch stop layer. The illustrative method further includes forming a sacrificial polish layer above the substrate and the gate electrode structure, performing a first planarization process on the sacrificial polish layer of material to remove a portion of the sacrificial polish layer or material until the layer of spacer material positioned above the gate electrode structure is exposed for further processing, and performing a second planarization process to remove the portion of the layer of spacer material positioned above the gate electrode, the portion of the etch stop layer positioned above the gate electrode and the gate cap layer.

In one illustrative example, a novel device disclosed herein includes a gate electrode positioned above a semiconducting substrate, a first sidewall spacer positioned proximate the gate electrode, and an etch stop layer positioned on a side of the first sidewall spacer. The device further includes a layer of spacer material positioned on a side of the etch stop layer and a sacrificial polish layer positioned on the layer of spacer material, wherein each of the gate electrode, the first sidewall spacer, the etch stop layer, the layer of spacer material and the sacrificial polish layer have exposed upper surfaces that are all positioned in approximately the same plane.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to techniques that may be employed in removing gate cap materials while reducing or perhaps eliminating at least some of the problems discussed in the background section of this application. In some cases, the methods and devices may include a high-k dielectric material (k value greater than 10) and a metal-containing electrode material. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, resistors, conductive lines, etc. With reference to FIGS. 1A-1G, various illustrative embodiments of the methods and devices disclosed herein will now be described in more detail.

Figure 1A:
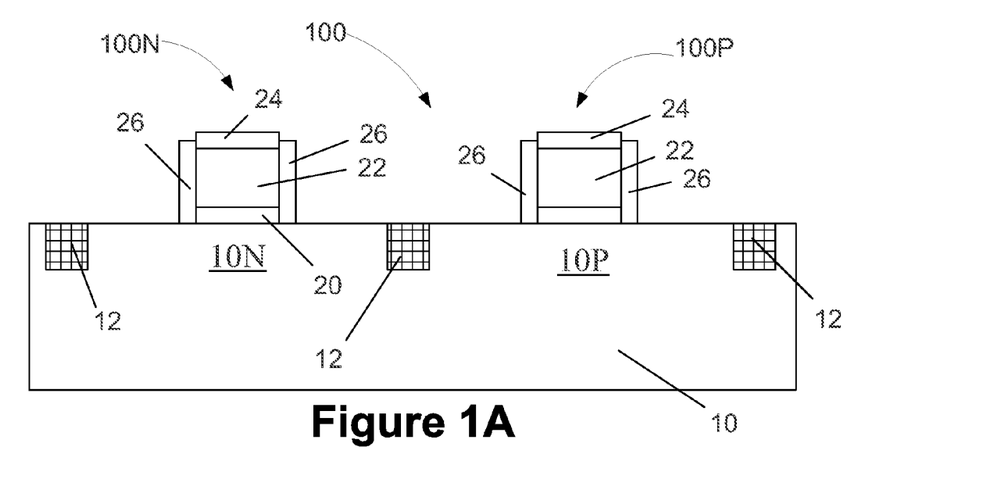
FIGS. 1A-1G depict one illustrative process flow disclosed herein for removing gate cap materials.

FIG. 1A is a simplified view of an illustrative semiconductor device 100 at an early stage of manufacturing that is formed above a semiconducting substrate 10. The device generally comprised an illustrative PMOS transistor 100P and a NMOS transistor 100N formed in an PMOS region 10P and an NMOS region 10N, respectively, of the substrate 10. The substrate 10 may have a variety of configurations, such the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 10 may also be made of materials other than silicon.

At the point of fabrication depicted in FIG. 1A, each of the PMOS transistor 100P and the NMOS transistor 100N includes a gate electrode structure that includes an illustrative gate insulation layer 20 that may be made of, for example, silicon dioxide, and an illustrative gate electrode 22 that may be made of, for example, polysilicon. The gate electrode 22 may also be a so-called high-k metal gate that includes a high-k (k greater than 10) insulation layer, and one or more metal layers that act as the gate electrode 22 or as work function adjusting metals, e.g., a layer of, for example, titanium nitride, combined with a conductive layer that may be made of, for example, polysilicon, amorphous silicon, etc. As will be recognized by those skilled in the art after a complete reading of the present application, the gate electrode structure of the device, i.e., the gate insulation layer 20 and the gate electrode 22, may be comprised of a variety of different materials and may have a variety of configurations, and they may be made using either so-called gate-first or gate-last techniques. Each of the illustrative device 100P, 100N, depicted in FIG. 1A also includes an illustrative gate cap layer 24 and first sidewall spacers 26 positioned proximate the gate electrode 22.

The configuration and composition of these various structures depicted in FIG. 1A may also vary depending upon the application, and they may be manufactured using techniques well known to those skilled in the art. For example, the gate insulation layer 20 may be a layer of silicon dioxide and/or a layer of a high-k material, and it may be formed by a thermal growth process or by performing a deposition process. In one illustrative embodiment, the gate electrode 22 may be comprised of polysilicon while the gate cap layer 24 may be a layer of silicon nitride. In one illustrative embodiment, the gate cap layer 24 may have a thickness ranging from approximately 25-50 nm.

In a typical process flow, the isolation structures 12, e.g., silicon dioxide, are initially formed in the substrate 10. Thereafter, the gate insulation layer 20 is formed above the active areas 10N, 10P, e.g., a layer of silicon dioxide may be thermally grown on the substrate 10. Then, a layer of gate electrode material, e.g., polysilicon, may be blanket-deposited across the substrate 10, followed by the blanket-deposition of the material of the gate cap layer 24, such as silicon nitride, on the layer of gate electrode material. Thereafter, a patterned masking layer (not shown), e.g., a photoresist material, is formed above the layer of the gate cap material. Next, one or more etching processes are performed on the gate cap material layer and on the layer of gate electrode material to define the gate cap layer 24 and the gate electrode 22 depicted in FIG. 1A. Then, the illustrative first sidewall spacers 264 may be made by blanket-depositing a layer of spacer material, e.g., silicon nitride, above the substrate 10 and performing an anisotropic etching process. In one illustrative embodiment, the first spacers 26 may have a thickness ranging from approximately 3-5 nm. In some embodiments, the may be a liner layer or other spacers positioned between the first spacer 26 and the gate electrode 22. Thus, the short hand reference to the spacers 26 as the "first" spacers does not mean that such spacers were literally the first ones formed when making the devices 100N, 100P. Additionally, when it is stated herein or in the claims that a sidewall spacer is formed "proximate" a structure or component, such as a gate electrode, such language will be understood to cover situations where such a spacer actually contacts the structure or component, as well as a situation where there are one or more intervening layers of material between the spacer and the structure or component.

Of course, FIGS. 1A-1G do not depict all aspects of a completed version of the PMOS transistor 100P of the NMOS transistor 100N. For example, prior to forming the first sidewall spacers 26, multiple ion implant process may be performed to form so-called halo implant regions and extension implant regions in the substrate 10, but such implant regions are not depicted so as not to obscure the present inventions. As another example, in some cases, recesses may be formed in the substrate 10 proximate the gate electrode structure of the PMOS transistor 100 only, and an epitaxially grown silicon-germanium material may be formed in those recesses. The epitaxial silicon-germanium material may help to impart a desirable compressive stress in the channel region of the PMOS transistor 100P. Such silicon-germanium materials are not depicted in the drawings for purposes of clarity.

Figure 1B:
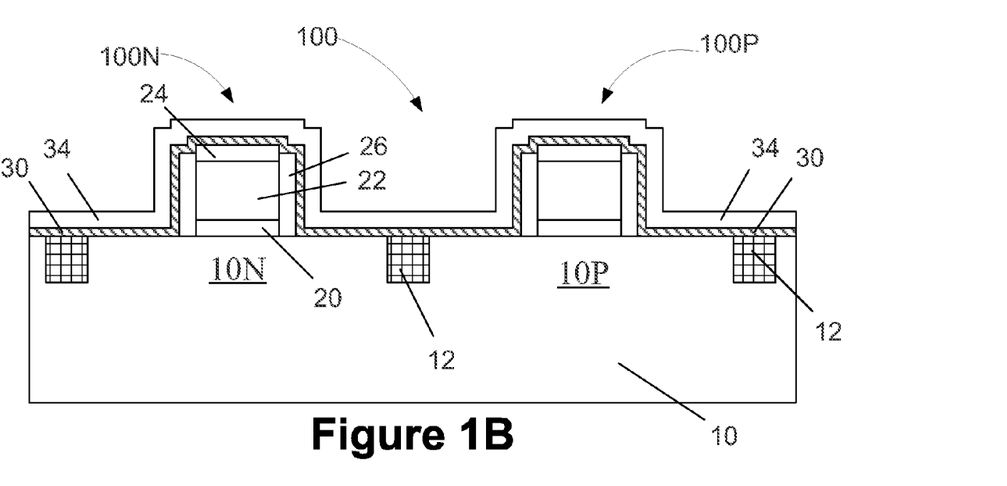

Next, as shown in FIG. 1B, in one illustrative embodiment, an illustrative etch stop layer 30 is formed above the device 100. In one illustrative embodiment, the etch stop layer 30 may be comprised of silicon dioxide, etc., and it may have a thickness ranging from approximately 2-3 nm. The illustrative etch stop layer 30 may be formed by any technique, such as atomic layer deposition (ALD), chemical vapor deposition (CVD), or a thermal growth process. In one particularly illustrative example, the illustrative etch stop layer 30 may be a layer of silicon dioxide that is conformally deposited using a highly conformal CVD deposition process.

Then, as shown in FIG. 1B, a layer of spacer material 34 is blanket-deposited above the device 100. In one particularly illustrative embodiment, the illustrative layer of spacer material 34 may be a layer of silicon nitride having a thickness of 5-10 nm that is conformally deposited using a highly conformal CVD deposition process.

Figure 1C:
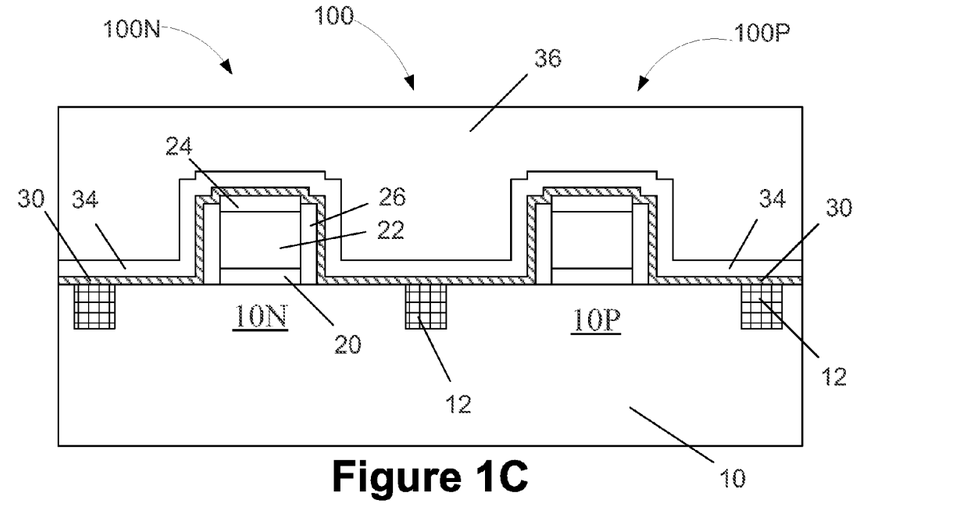

FIG. 1C depicts the device 100 at a point of fabrication where a sacrificial polish layer 36 has been formed above the substrate 10. In one illustrative embodiment, the sacrificial polish layer 36 is made of flowable material such as silicon dioxide, a spin-on glass, a spin-on dielectric, a photoresist material, etc., and it may have a thickness of approximately 200 nm. The sacrificial polish layer 36 may be formed by a variety of techniques such a spin-coating process or a deposition process. In one illustrative embodiment, the polish stop layer 36 may be made of a material that may subsequently planarized by performing, for example, a chemical mechanical polishing (CMP) process, as described more fully below.

Figure 1D:
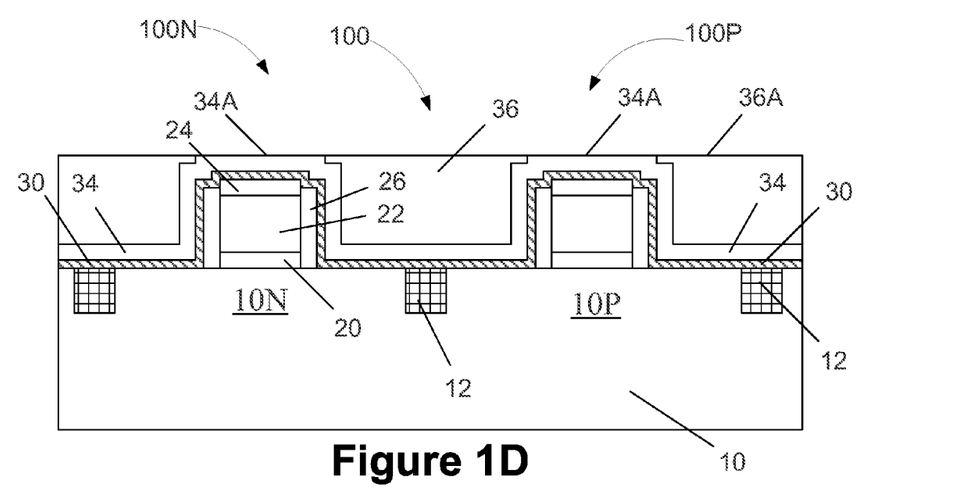

Next, as shown in FIG. 1D, a first planarization operation or process, e.g., a CMP process, is performed for such a duration that the surface 36A of the sacrificial polish layer 36 is approximately even with the surface 34A of the layer of spacer material 34, i.e., the layer of spacer material 34 acts as a polish stop layer during the illustrative CMP process. That is, the portion of the layer of spacer material 34 that is positioned above the gate electrode 22 is exposed for further processing. In one illustrative example, this may be accomplished by performing a CMP process with chemicals that permit this first CMP process to be performed at least somewhat selectively as between the sacrificial polish layer 36 and the layer of spacer material 34 (the CMP stop layer).

Figure 1E:
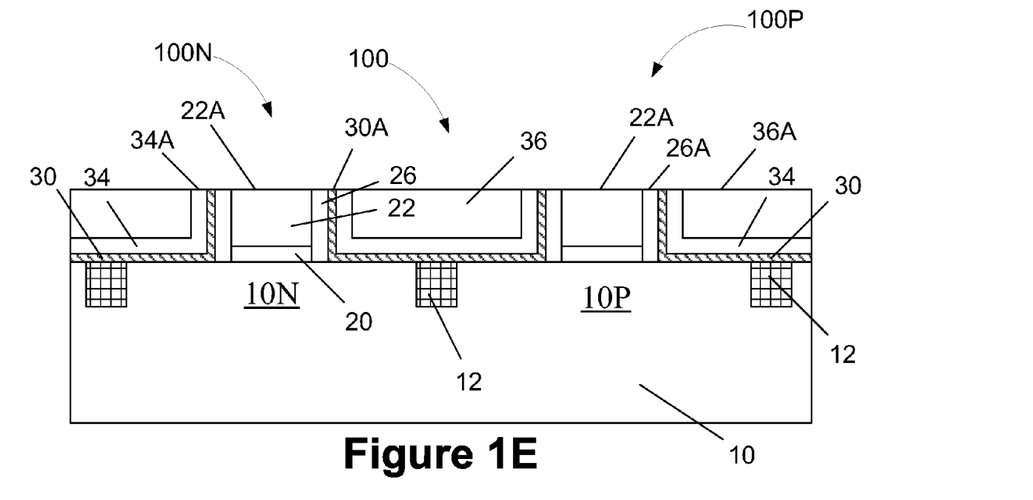

Then, as shown in FIG. 1E, a second planarization process, e.g., a CMP process, is performed to remove the portion of the layer of spacer material 34 that is positioned above the gate electrode 22, the portion of the etch stop layer 30 that is positioned above the gate electrode 22 and the gate cap layer 26. This second CMP process may be a relatively non-selective CMP process wherein the mechanical aspects of the CMP process may be the dominant removal mechanism. Additionally, it may be desirable that this second CMP process be performed with a different polishing pad and/or different chemicals than those used in the first CMP process described above. If desired, the second CMP process may actually be two or more separate CMP processes performed with different chemicals and/or polishing pads. Note that this process results in a unique device 100, wherein the exposed upper surfaces 22A of the gate electrode structures 22, the exposed upper surfaces 26A of the side wall spacers 26, the exposed upper surfaces 30A of the etch stop layer 30, and the exposed upper surfaces 34A of the layer of spacer material 34 are all positioned in approximately the same plane.

After this second CMP process is performed, the remaining portions of the sacrificial polish layer 36 may be removed. Depending upon the material used for the sacrificial polish layer 36, this removal may be accomplished by using various techniques. For example, in the case where the sacrificial polish layer 36 is silizane, it may be removed by using a solvent. If poly-silizane is used for the sacrificial polish layer 36, it may be removed by using a dilute HF acid process. In the case where the sacrificial polish layer 36, is made of a photoresist material, it may be removed by an $O_2$ flash process or by performing a wet etching/cleaning process using SPM/SC1.

Figure 1F:
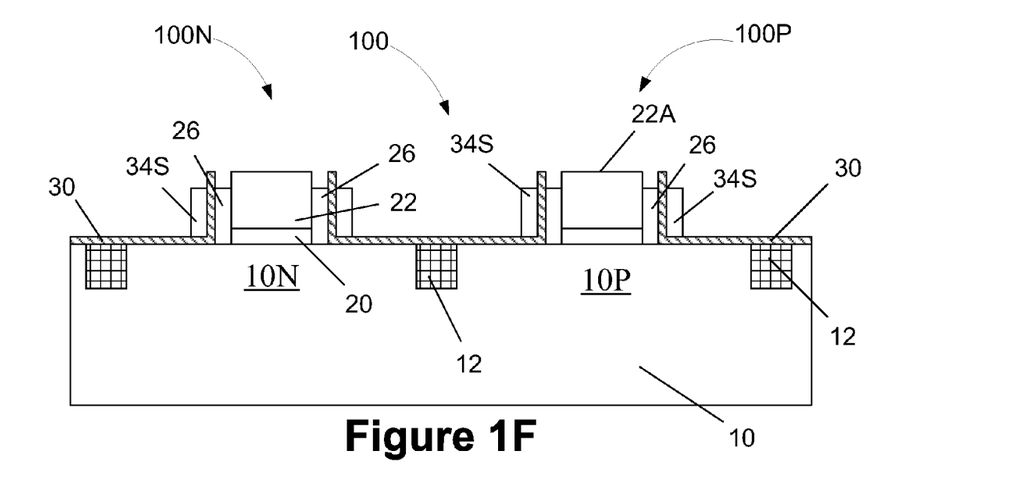

Then, as shown in FIG. 1F, a first etching process, e.g., an anisotropic etching process, is performed on the layer of spacer material 34 to define second sidewall spacers 34S. Again, the short hand reference to the spacers 34S as the "second" spacers does not mean that such spacers were literally the second ones formed when making the devices 100N, 100P. The first etching process is selective relative to the underlying etch stop layer 30, which protects the underlying active regions and isolation regions 12 during the spacer etch process. Note that during this spacer etch process, the height of the first sidewall spacers 24 may also be reduced if they are made of the same material as the second spacers 34S. Additionally, to the extent the second planarization process described above did not remove all of the gate cap layer 24, any residual portions may be removed in this first etch process.

Figure 1G:
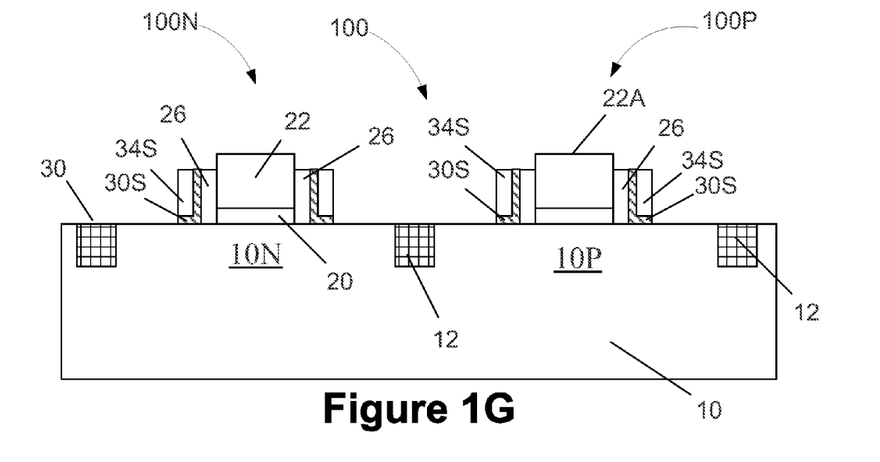

Then, as shown in FIG. 1G, a second etching process is performed to remove exposed portions of the etch stop layer 30 to thereby define third generally L-shaped spacers 30S positioned between the spacers 24 and 34S. During this second etching process, the isolations structures 12 may also be attacked once the etch stop layer 30 is cleared, but given that the etch stop layer 30 is relatively thin, any attack on the isolation structures 12 should be very limited and should not materially affect the integrity of the isolation structures 12.

Thereafter, the device 100 may be subjected to additional known processing operations to complete the formation of the devices 100N, 100P. For example, such processes may include performing source/drain implantation processes, performing a heating process to activate the implanted dopants and repair damage to the lattice structure of the substrate 10; formation of metal silicide regions (not shown) on the gate electrode 22 and on the source/drain regions (not shown); and forming various contact and metallization structures in various layers of insulating material formed above the substrate 10. These various structures are not depicted in the drawings so as not to obscure the present inventions.

It should be noted that, in the claims, various planarization processes, spacers and/or etching processes described herein may be referred to a "first", "second", or "third" planarization processes, spacers and/or etching processes, as the case may be, for ease of reference. However, the use of such terminology in the claims should not be understood to mean that the various operations or structures are formed in a sequence that corresponds to the short-hand terminology employed in the claims. That is, for example, in the claims, a "second" planarization process may, in one particular example described herein, actually be performed prior to a so-called "first" planarization process, depending upon the language of the claims and the process flow employed to perform the inventive methods herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a gate electrode structure above a semiconducting substrate, the gate electrode structure comprising at least a gate insulation layer positioned above said substrate, a gate electrode positioned above said gate insulation layer, a first sidewall spacer positioned proximate said gate electrode, and a gate cap layer positioned on said gate electrode;
forming an etch stop layer above said gate cap layer and above a surface of said substrate proximate said gate electrode structure;
forming a layer of spacer material above said etch stop layer;
performing a first planarization process to remove the portion of said layer of spacer material positioned above said gate electrode, the portion of said etch stop layer positioned above said gate electrode, and said gate cap layer so as to thereby expose an upper surface of said gate electrode; and
after performing said first planarization process and exposing said upper surface of said gate electrode, performing a first anisotropic etching process on said layer of spacer material to define a second sidewall spacer while using said etch stop layer as an etch stop during said first etching process.

2. The method of claim 1, further comprising performing a second etching process on said etch stop layer to define a third generally L-shaped spacer positioned between said first sidewall spacer and said second sidewall spacer.

3. The method of claim 1, wherein forming said gate electrode structure comprises forming said gate insulation layer on a surface of said substrate, forming said gate electrode on said gate insulation layer and forming said first sidewall spacer in contact with a sidewall of said gate electrode.

4. The method of claim 1, wherein forming said etch stop layer comprises forming said etch stop layer on said gate cap layer and on surfaces of said substrate proximate said gate electrode structure.

5. The method of claim 1, wherein said etch stop layer is comprised of silicon dioxide and said first sidewall spacer, said gate cap layer and said layer of spacer material are each comprised of silicon nitride.

6. The method of claim 1, wherein performing said first planarization process comprises performing a chemical mechanical planarization process.

7. The method of claim 1, wherein the method further comprises:
prior to performing said first planarization process, forming a sacrificial polish layer of material above said substrate and said gate electrode structure;
performing a second planarization process on said sacrificial polish layer of material to remove a portion of said sacrificial polish layer of material until said layer of spacer material positioned above said gate electrode structure is exposed for further processing; and
after performing said first planarization process to expose said upper surface of said gate electrode, removing said sacrificial polish layer from above said substrate.

8. The method of claim 7, wherein said first planarization process is performed using a different polishing pad and a different polishing chemistry than was used during said second planarization process.

9. The method of claim 7, wherein performing said second planarization process comprises performing a chemical mechanical planarization process.

10. A method, comprising:
forming a gate electrode structure above a semiconducting substrate, the gate electrode structure comprising at least a gate insulation layer positioned on a surface of said substrate, a gate electrode positioned above said gate insulation layer, a first sidewall spacer positioned proximate said gate electrode, and a gate cap layer positioned on said gate electrode;
forming an etch stop layer on said gate cap layer and on a surface of said substrate proximate said gate electrode structure;
forming a layer of spacer material on said etch stop layer;
forming a sacrificial polish layer above said substrate and said gate electrode structure;
performing a first planarization process on said sacrificial polish stop layer of material to remove a portion of said sacrificial polish layer until said layer of spacer material positioned above said gate electrode structure is exposed for further processing;
performing a second planarization process to remove the portion of said layer of spacer material positioned above said gate electrode, the portion of said etch stop layer positioned above said gate electrode and said gate cap layer so as to thereby expose an upper surface of said gate electrode; and
after performing said second planarization process to expose said upper surface of said gate electrode, removing said sacrificial polish layer from above said substrate.

11. The method of claim 10, further comprising, after performing said second planarization process and after removing said sacrificial polish layer, performing a first anisotropic etching process on said layer of spacer material to define a second sidewall spacer while using said etch stop layer as an etch stop during said first etching process to protect said substrate.

12. The method of claim 11, further comprising performing a second etching process on said etch stop layer to define a third generally L-shaped spacer positioned between said first sidewall spacer and said second sidewall spacer.

13. The method of claim 10, wherein performing said first planarization process comprises performing a chemical mechanical planarization process.

14. The method of claim 11, wherein performing said second planarization process comprises performing a chemical mechanical planarization process.

15. The method of claim 10, wherein said second planarization process is performed using a different polishing pad and a different polishing chemistry than was used during said first planarization process.

16. A method, comprising:
forming a gate electrode structure above a semiconducting substrate, the gate electrode structure comprising at least a gate insulation layer positioned on a surface of said substrate, a gate electrode positioned above said gate insulation layer, a first sidewall spacer positioned proximate said gate electrode, and a gate cap layer positioned on said gate electrode;
forming an etch stop layer on said gate cap layer and on a surface of said substrate proximate said gate electrode structure;
forming a layer of spacer material on said etch stop layer;
forming a sacrificial polish layer above said substrate and said gate electrode structure;
performing at least one planarization process to remove the portion of said layer of spacer material positioned above said gate electrode, the portion of said etch stop layer positioned above said gate electrode and said gate cap layer so as to thereby expose an upper surface of said gate electrode; and after performing at least one planarization process to expose said upper surface of said gate electrode, removing said sacrificial polish layer from above said substrate.

17. The method of claim 16, wherein performing said at least one planarization process comprises:

performing a first chemical mechanical planarization process that stops on and exposes a surface of said layer of spacer material; and after performing said first chemical mechanical polishing planarization, performing a second chemical mechanical planarization process that stops on and exposes said upper surface of said gate electrode.

* * * * *